(12) United States Patent
Liang et al.

(10) Patent No.: US 11,055,840 B2
(45) Date of Patent: Jul. 6, 2021

(54) SEMICONDUCTOR HOT-SPOT AND PROCESS-WINDOW DISCOVERY COMBINING OPTICAL AND ELECTRON-BEAM INSPECTION

(71) Applicant: KLA Corporation, Milpitas, CA (US)

(72) Inventors: Ardis Liang, Pleasanton, CA (US); Martin Plihal, Pleasanton, CA (US); Saravanan Paramasivam, Chennai (IN); Niveditha Lakshmi Narasimhan, Chennai (IN); Sandeep Bhagwat, Milpitas, CA (US)

(73) Assignee: KLA Corporation, Milpitas, CA (US)

( * ) Notice: Subject to any disclaimer, the term of this patent is extended or adjusted under 35 U.S.C. 154(b) by 113 days.

(21) Appl. No.: 16/582,846

(22) Filed: Sep. 25, 2019

(65) Prior Publication Data

US 2021/0042908 A1    Feb. 11, 2021

(51) Int. Cl.
*G06T 7/00* (2017.01)
*G01N 21/95* (2006.01)

(52) U.S. Cl.
CPC ....... *G06T 7/0004* (2013.01); *G01N 21/9501* (2013.01); *G06T 2207/30148* (2013.01)

(58) Field of Classification Search
CPC ............. G01N 21/9501; G01N 21/956; G01N 21/9505; G01N 2223/6116; G01N 2223/646; G01N 2021/8854; G01N 2201/10; G06T 2207/30148;
(Continued)

(56) References Cited

U.S. PATENT DOCUMENTS 8,716,662 B1      5/2014   MacDonald et al.
9,518,934 B2 *   12/2016   Chen .................... G03F 7/7065
9,835,566 B2     12/2017   Liang et al.
(Continued)

FOREIGN PATENT DOCUMENTS

KR         20170082559 A        7/2017

OTHER PUBLICATIONS

PCT/US2020/045084, International Search Report, dated Nov. 19, 2020.
(Continued)

*Primary Examiner* — Hoa Q Pham
(74) *Attorney, Agent, or Firm* — Huse IP Law; Charles C. Huse

(57) ABSTRACT

To evaluate a semiconductor-fabrication process, a semiconductor wafer is obtained that includes die grouped into modulation sets. Each modulation set is fabricated using distinct process parameters. The wafer is optically inspected to identify defects. A nuisance filter is trained to classify the defects as DOI or nuisance defects. Based on results of the training, a first, preliminary process window for the wafer is determined and die structures having DOI are identified in a first group of modulation sets bordering the first process window. The trained nuisance filter is applied to the identified defects to determine a second, revised process window for the wafer. A third, further revised process window for the wafer is determined based on SEM images of specified care areas in one or more modulation sets within the second, revised process window. A report is generated that specifies the third process window.

19 Claims, 9 Drawing Sheets

(58) Field of Classification Search
CPC . G06T 2207/20081; G06T 2207/10061; G06T 7/0002; G03F 7/7065
USPC .............................. 382/149, 144, 145, 159; 356/237.1–237.5
See application file for complete search history.

(56) References Cited

U.S. PATENT DOCUMENTS

| | | | |
|---|---|---|---|
| 10,267,748 B2 | 4/2019 | Plihal et al. | |
| 10,713,534 B2* | 7/2020 | Brauer | G06K 9/6262 |
| 2008/0163140 A1* | 7/2008 | Fouquet | G03F 1/84 700/110 |
| 2011/0268345 A1 | 11/2011 | Nakagaki et al. | |
| 2016/0123898 A1 | 5/2016 | Chen et al. | |
| 2016/0258879 A1 | 9/2016 | Liang et al. | |
| 2016/0274036 A1 | 9/2016 | Plihal | |
| 2018/0149603 A1* | 5/2018 | Bhattacharyya | G01N 21/9505 |
| 2018/0164792 A1* | 6/2018 | Lin | G05B 19/41875 |
| 2020/0234428 A1* | 7/2020 | George | G06K 9/627 |

OTHER PUBLICATIONS

PCT/US2020/045084, Written Opinion of the International Searching Authority, dated Nov. 19, 2020.

* cited by examiner

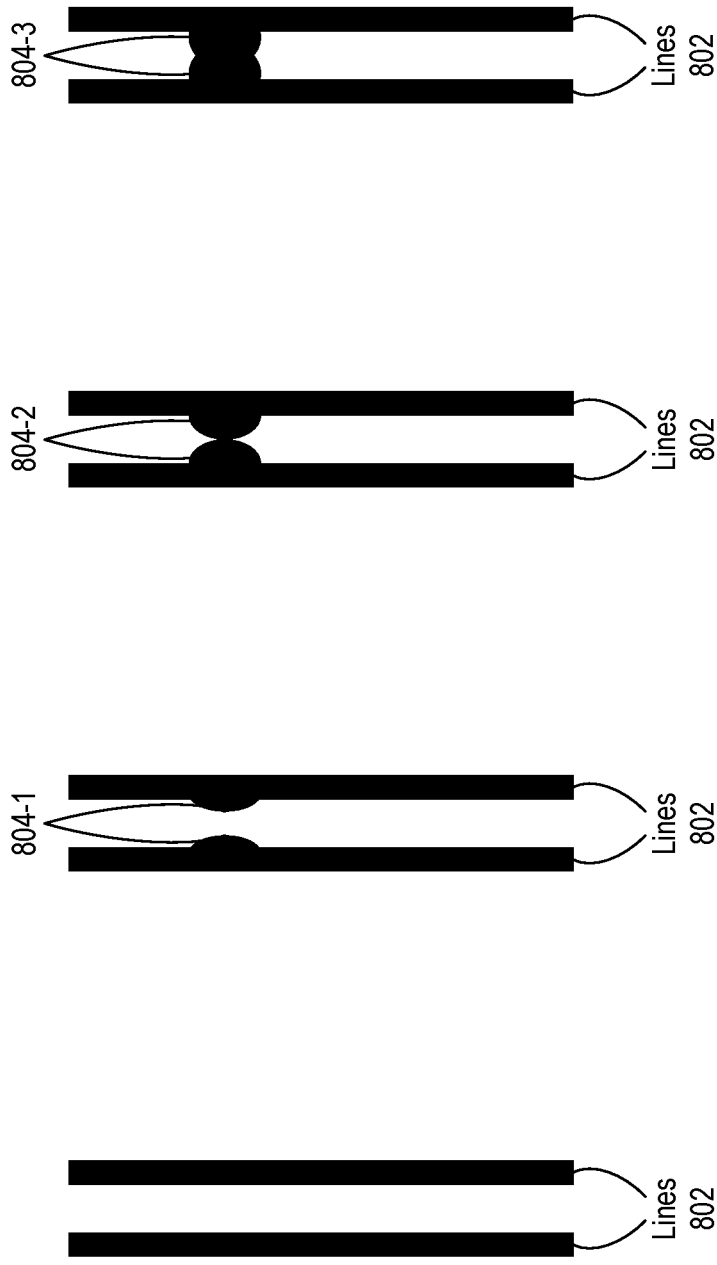

SEMICONDUCTOR HOT-SPOT AND PROCESS-WINDOW DISCOVERY COMBINING OPTICAL AND ELECTRON-BEAM INSPECTION

RELATED APPLICATION

This application claims priority to Indian (IN) Patent Application No. 201941031907, filed on Aug. 7, 2019, which is incorporated by reference in its entirety for all purposes.

TECHNICAL FIELD

This disclosure relates to semiconductor fabrication, and more specifically to performing defect inspection and classification to identify a fabrication process window.

BACKGROUND

To determine a process window for semiconductor fabrication, a semiconductor wafer called a DOE wafer may be fabricated based on an experimental design (i.e., a "design of experiments" or DOE) and inspected for defects. Examples of DOE wafers include process window qualification (PWQ) wafers and focus-exposure matrix (FEM) wafers). Traditionally, optical inspection (e.g., using an inspection tool with a broadband plasma (BBP) light source) is combined with massive scanning electron microscope (SEM) analysis in a two-step technique to determine the process window. In the first step, failing structures are identified. In the second step, the process window for the failing structures is determined. This traditional two-step technique is lengthy and uses inefficient sampling, which often limits users to performing the technique only once.

SUMMARY

Accordingly, there is a need for improved methods and systems of combining optical inspection (e.g., BBP inspection) and SEM inspection to determine a semiconductor fabrication process window.

In some embodiments, a method of evaluating a semiconductor-fabrication process includes obtaining a semiconductor wafer that includes a plurality of die grouped into modulation sets, wherein each modulation set is fabricated using distinct process parameters, and optically inspecting the semiconductor wafer to identify defects in the modulation sets. A nuisance filter is trained to classify the identified defects as defects of interest (DOI) or nuisance defects. Training the nuisance filter includes performing automatic defect classification for scanning-electron-microscope (SEM) images of a first sample of the identified defects to determine whether respective defects in the first sample are DOI or nuisance defects. Based on results of the training, a first, preliminary process window for the semiconductor wafer is determined. The first process window is a window of process parameters for which respective modulation sets are free of DOI. Also based on the results of the training, die structures having DOI are identified in a first group of modulation sets bordering the first process window. The trained nuisance filter is applied to the identified defects to determine a second, revised process window for the semiconductor wafer. Determining the second process window includes determining, for each modulation set situated within the first window and having a respective process modulation immediately adjacent to a process modulation of a respective modulation set of the first group, whether the modulation set has one or more DOI for a structure identified as having a defect of interest in the respective modulation set of the first group. A third, further revised process window for the semiconductor wafer is determined based on SEM images of specified care areas in one or more modulation sets within the second, revised process window. A report is generated that specifies the third process window.

In some embodiments, a semiconductor-inspection system includes an optical inspection tool, one or more processors, and memory storing one or more programs for execution by the one or more processors. The one or more programs include instructions for performing the above method. In some embodiments, a non-transitory computer-readable storage medium stores one or more programs configured for execution by one or more processors of a semiconductor-inspection system that includes an optical inspection tool. The one or more programs include instructions for performing the above method.

BRIEF DESCRIPTION OF THE DRAWINGS

For a better understanding of the various described implementations, reference should be made to the Detailed Description below, in conjunction with the following drawings.

FIGS. 8A-8D show an example of a die structure that is subject to a systematic defect that varies as a function of process modulation.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
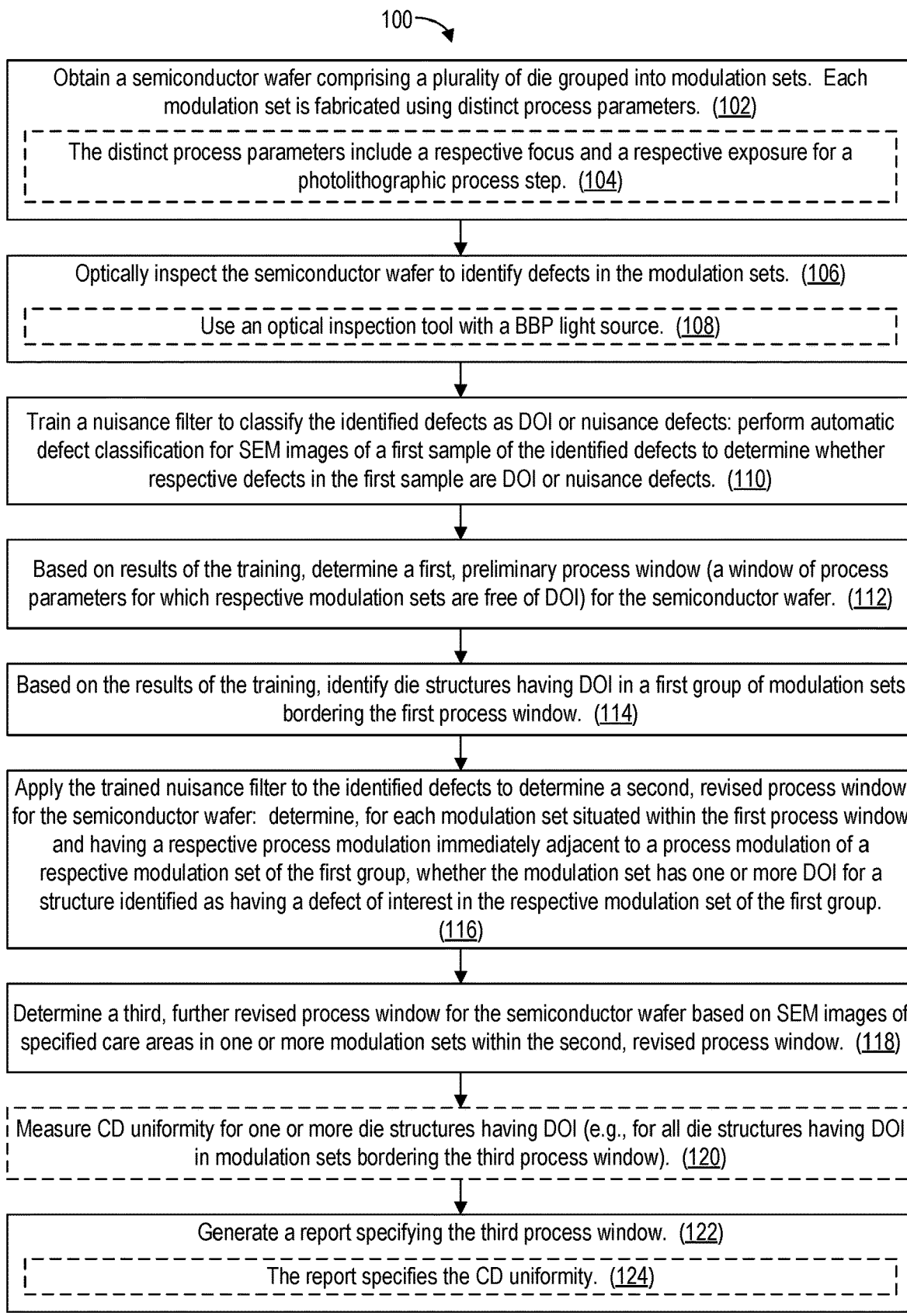
FIG. 1 is a flowchart showing a method of evaluating a semiconductor-fabrication process, in accordance with some embodiments.

FIG. 1 is a flowchart showing a method 100 of evaluating a semiconductor-fabrication process, in accordance with some embodiments. The method 100 may be performed using a semiconductor inspection system 900 (FIG. 9) or portion thereof.

In the method 100, a semiconductor wafer is obtained (102) that includes a plurality of die grouped into modulation sets. The semiconductor wafer is a DOE wafer (e.g., a PWQ or FEM wafer) and each modulation set is fabricated using distinct process parameters. For example, the semiconductor wafer 700 (FIGS. 7A-7D) includes multiple modulation sets 702, each of which is fabricated using distinct process parameters. Each modulation set 702 includes one or more semiconductor die (e.g., a plurality of semiconductor die arranged in an array, with the arrangement being specified by arrays of die layers on corresponding reticles used to fabricate the die). In some embodiments, each modulation set 702 is a portion of the semiconductor wafer fabricated in part through a single instance of photolithographically exposing only the portion, and not other portions of the wafer, through a reticle. In some embodiments, the distinct process parameters include (104) a respective focus and a respective exposure (i.e., dose) for a photolithographic process step, such that each modulation set 702 was fabricated using a distinct combination of focus and exposure for a particular photolithographic process step. For example, each column of modulation sets 702 on the wafer 700 may be fabricated using a distinct focus and each row of modulation sets 702 on the wafer 700 may be fabricated using a distinct exposure (or vice versa). For the wafer 700, the exposure may vary monotonically along the columns and/or the focus may vary monotonically along the rows (or vice versa). Other arrangements of modulation sets are possible, however; in general, the locations on the wafer of modulation sets with particular combinations of process parameters may be arbitrary. Fabrication of the semiconductor wafer may be either complete or incomplete when the method 100 is performed.

The semiconductor wafer is optically inspected (106) to identify defects in the modulation sets. In some embodiments, an optical inspection tool with a BBP light source is used (108) to inspect the wafer. The optical inspection may be performed using a single optical mode or a plurality of optical modes (e.g., two optical modes). Each optical mode has a distinct combination of optical characteristics. In some embodiments, the optical characteristics include the range of wavelengths, polarization, focus, aperture (e.g., transmission distribution in the illumination aperture and transmission distribution in the collection aperture), and/or phase-shift distribution in the collection aperture. A first optical mode differs from a second optical mode in that the value of at least one of the optical characteristics is different. For a given optical mode, defects may be identified by scanning the semiconductor wafer to generate target images of respective die on the wafer. A reference image of the die is subtracted from the target image (or vice-versa) on a pixel-by-pixel basis, to produce a difference image that reveals defects. For example, if pixel values for a particular area in the difference image have an intensity that satisfies a threshold, then the area is identified as having a defect. The scanning may not detect some defects, because the defects are very small or do not cause a change in reflectivity of the incoming light.

Detected defects include defects of interest (DOI), which impede device functionality, and so-called nuisance defects, which do not impede device functionality. Unlike DOI, nuisance defects are typically not of interest to engineers. Nuisance defects may outnumber defects of interest. The presence of nuisance defects prevents a process window from being immediately determined based on the optical inspection, as does the possibility that the optical inspection did not detect some DOI.

FIGS. 8A-8D show an example of a die structure that is subject to a systematic defect that varies as a function of process modulation. A process parameter varies monotonically from FIG. 8A to 8D by experimental design (e.g., in accordance with a DOE for the semiconductor wafer on which the die structure is found). FIG. 8A shows a non-defective pair of metal lines 802 that are separated and thus electrically isolated from each other. No bridging is present between the metal lines 802. In FIG. 8B, a bridge 804-1 has begun to form but is incomplete, such that the metal lines 802 remain electrically isolated. The bridge 804-1 may be considered a nuisance defect if detected. In FIG. 8C the bridging has become more pronounced, such that a bridge 804-2 now shorts the metal lines 802. In FIG. 8D, the bridging is even more pronounced, such that a bridge 804-3, which is wider than the bridge 804-2 at its narrowest point, shorts the metal lines 802. The bridges 804-2 and 804-3 are considered DOI if detected.

To allow nuisance defects to be filtered out and thus not considered when determining the process window, a nuisance filter is trained (110) to classify the identified defects as DOI or nuisance defects. The nuisance filter performs this classification based on pixel data for defects detected in the optical inspection of step 106. In some embodiments, the nuisance filter not only classifies the defects as DOI or nuisance defects, but also assigns likelihoods (e.g., probabilities) that respective defects are DOI or nuisance defects. Training the nuisance filter includes performing automatic defect classification for SEM images of a first sample of the identified defects to determine whether respective defects in the first sample are DOI or nuisance defects. This defect classification is automatic in that it is performed in software, without user review or input. The automatic defect classification of the SEM images, which labels respective defects as DOI or nuisance defects, provides a ground truth against which the predictions of the nuisance filter are compared. Training the nuisance filter is an iterative process in accordance with some embodiments: identified defects are sampled, SEM review of the sampled defects is performed, automatic defect classification of the sampled defects is performed based on the SEM review, the nuisance filter is improved accordingly, and the process is repeated until convergence occurs. The first sample may include the identified defects that are sampled during all of the iterations in this process. The method 200 (FIG. 2, described below) is an example of nuisance filter training, in accordance with some embodiments.

In some embodiments, the nuisance filter and/or the automatic defect classification divide DOI into different types of defects (i.e., different DOI classes).

Based on results of the training (i.e., based on data obtained during the training process of step 110, as opposed to data obtained through subsequent use of the nuisance filter once the training is complete) (e.g., based on the automatic defect classification performed for the SEM images), a first, preliminary process window (i.e., a window of process parameters for which respective modulation sets are free of DOI) is determined (112) for the semiconductor wafer. For example, in FIG. 7B the first process window corresponds to the modulation sets 702 that do not include DOI 706, but instead either only include nuisance defects 704 or do not include any defects. The first process window is bordered by a first group of modulation sets 708 that include one or more DOI 706 and have process modulations immediately adjacent to process modulations of respective modulation sets in the first process window. For example, the modulation set 708-1 has a process modulation that differs from the process modulation of a modulation set 702-1 in the first process window by a single step in the DOE (assuming monotonic variance of a process parameter along columns of modulation sets), and thus is immediately adjacent to the process modulation of the modulation set 702-1.

Also based on the results of the training (e.g., based on the automatic defect classification performed for the SEM images), die structures having DOI in a first group of modulation sets bordering the first process window are identified (114). To make this identification, DOI are mapped to respective die structures on which they occur through a process known as design-group binning (DGB), which uses a file specifying the die layout (e.g., a gds file). A die may have a single instance or multiple instance of a particular structure. The presence of a DOI on a particular die structure may indicate a propensity of failure for the die structure, such that the DOI is systematic. (Alternatively, the presence of a DOI on a particular die structure may be random.) An example of identifying die structures having DOI in a first group of modulation sets is described in the method 300 (FIG. 3, described below), in accordance with some embodiments.

Figure 7A:
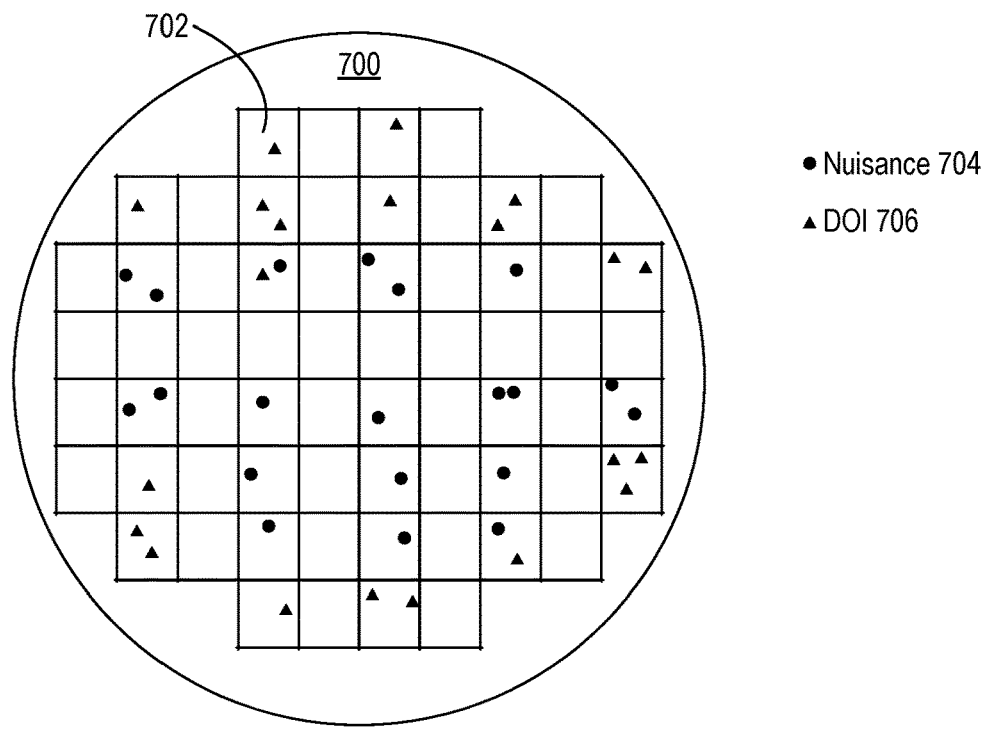
FIGS. 7A-7D show a semiconductor wafer with multiple modulation sets, each of which is fabricated using distinct process parameters, in accordance with some embodiments.
Figure 7B:
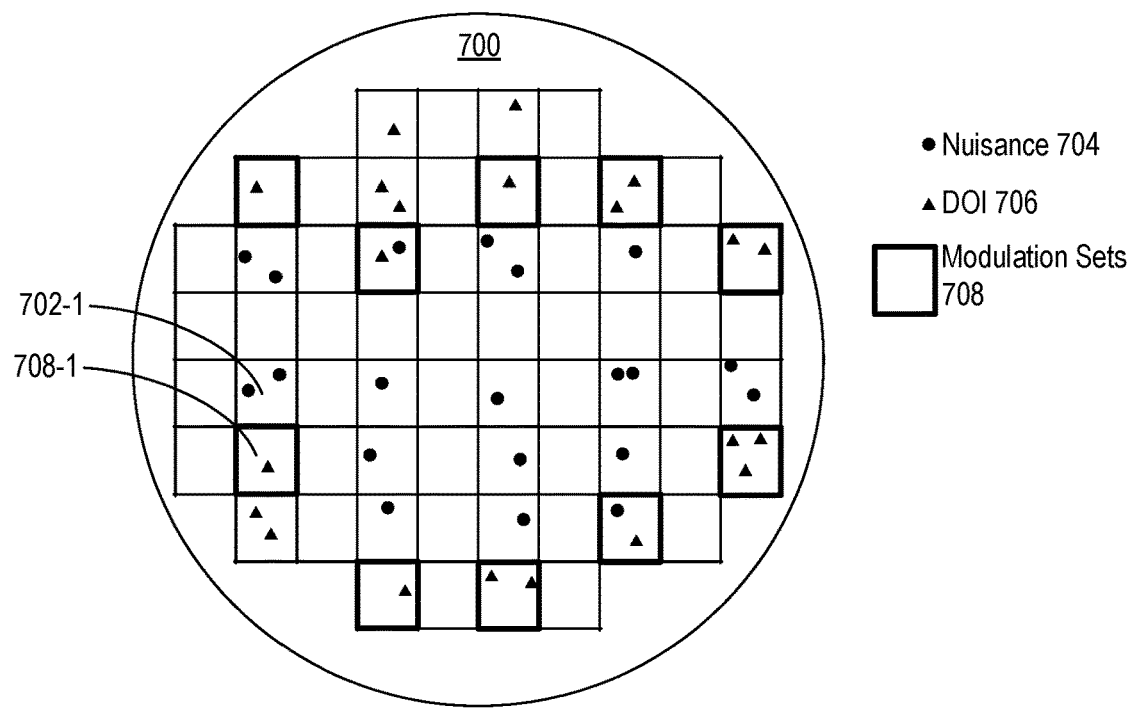
Figure 7C:
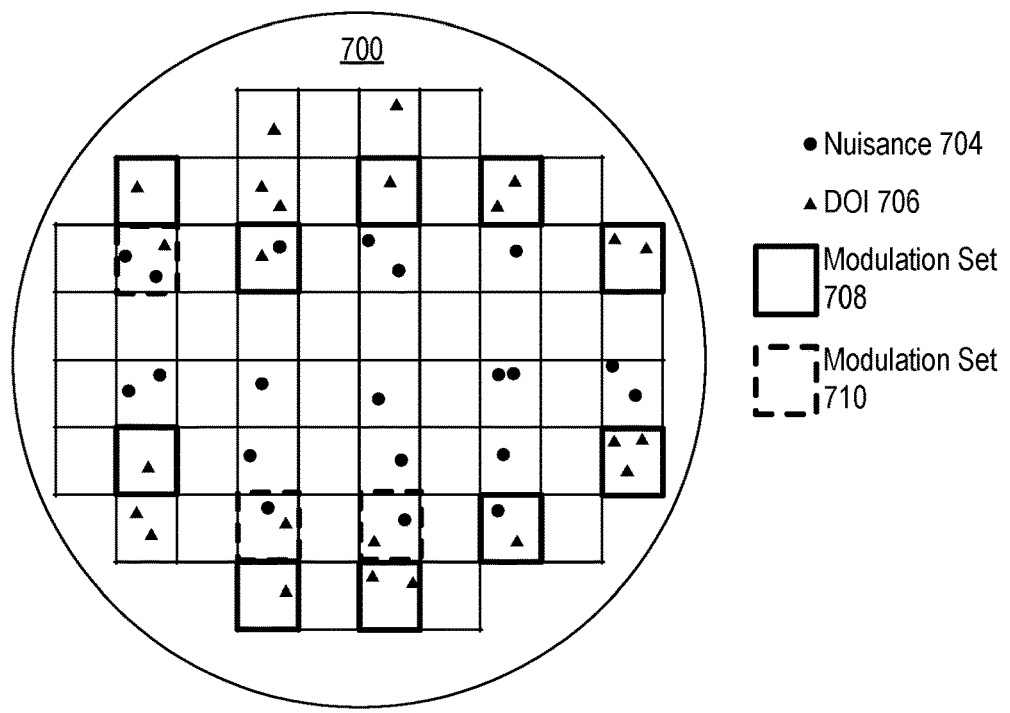

The trained nuisance filter is applied (116) to the identified defects to determine a second, revised process window for the semiconductor wafer. Determining the second, revised process window includes determining, for each modulation set situated within the first process window and having a respective process modulation immediately adjacent to a process modulation of a respective modulation set of the first group, whether the modulation set has one or more DOI for a structure identified as having a defect of interest in the respective modulation set of the first group. For example, each modulation set 710 in FIG. 7C is in the process window of FIG. 7B, has a process modulation immediately adjacent to a process modulation of a respective modulation set 708 (assuming monotonic process-parameter variation along columns of modulation sets on the wafer 700), and has one or more DOI 706 on respective die structures. (The DOI 706 in the modulation sets 710 are not shown in FIGS. 7A and 7B because they are not detected until step 116.) The process window of the wafer 700 in FIG. 7C is thus revised with respect to the process window in FIG. 7B: it is narrower. An example of determining the second, revised process window is described in the method 400 (FIG. 4, described below), in accordance with some embodiments.

Figure 7D:
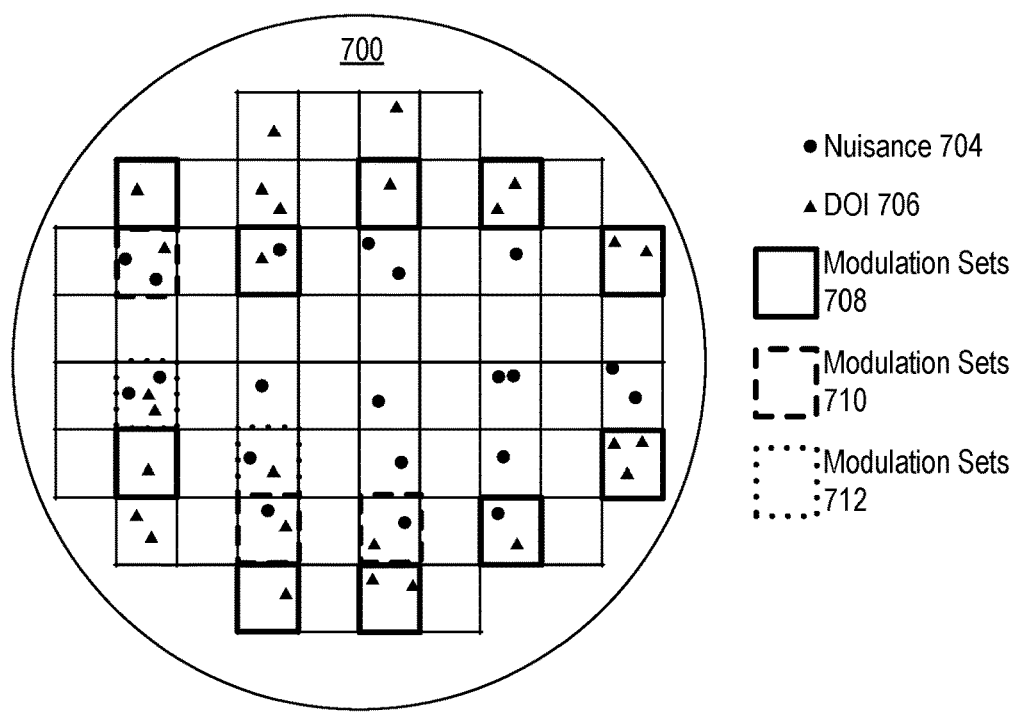

A third, further revised process window for the semiconductor wafer is determined (118) based on SEM images of specified care areas in one or more modulation sets within the second, revised process window. The SEM images may reveal DOI in modulation sets in which no DOI were previously detected, causing the process window to be revised accordingly. For example, previously undetected DOI 706 in modulation sets 712 (FIG. 7D) are identified by performing automatic defection classification for the SEM images, and the process window is narrowed accordingly (e.g., the process window in FIG. 7D is narrower than the process window in FIG. 7C, which is narrower than the process window in FIG. 7B). An example of determining the third, further revised process window is described in the method 500 (FIG. 5, described below), in accordance with some embodiments.

In some embodiments, critical dimension (CD) uniformity is measured (120) for one or more die structures having DOI (e.g., for all die structures having DOI in modulation sets bordering the third process window). An example of measuring CD uniformity is described in the method 600 (FIG. 6, described below), in accordance with some embodiments.

A report is generated (122) specifying the third process window. In some embodiments, the report specifies the process modulations (or corresponding modulation sets) at which respective die structures fail (or start to fail). In some embodiments, the report specifies one or more (e.g., all) die structures having DOI in modulation sets bordering the third process window. In some embodiments, the report specifies (124) the CD uniformity measured in step 120. The report may be displayed (e.g., on a display 907, FIG. 9) and/or transmitted to a remote device (e.g., client device) for display. The data in the report may be used to identify changes to be made in a design of a semiconductor device (e.g., a layout change; a design-rule change) and/or in a semiconductor fabrication process.

Figure 2:
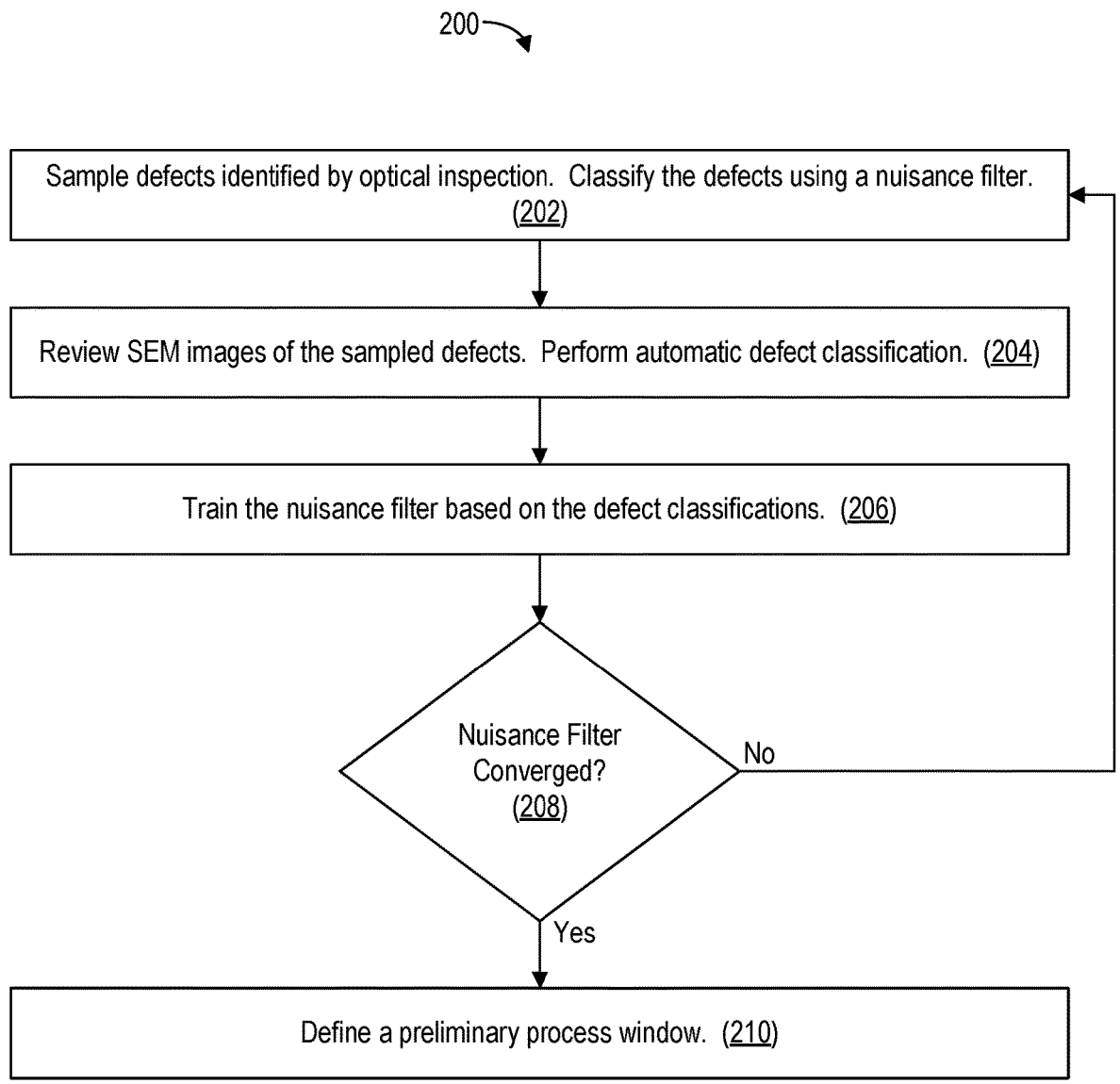
FIG. 2 is a flowchart showing a method of training a nuisance filter and making a preliminary process-window determination, in accordance with some embodiments.

FIG. 2 is a flowchart showing a method 200 of training a nuisance filter (e.g., as in step 110 of the method 100, FIG. 1) and making a preliminary process-window determination (e.g., as in step 112 of the method 100, FIG. 1), in accordance with some embodiments. The method 200 may be performed using a semiconductor inspection system 900 (FIG. 9) or portion thereof.

In the method 200, defects that have been identified by optical inspection are sampled (202) (i.e., a sample of defects that have been identified by optical inspection is selected). The defects are classified using a nuisance filter, either before or after the sample is selected. The sampled defects may include defects that the (as yet untrained) nuisance filter predicts are DOI 706 and defects that the nuisance filter predicts are nuisance defects 704 (FIG. 7A). Selecting different types of defects is desirable to ensure robust training of the nuisance filter.

SEM images of the sampled defects are reviewed and automatic defect classification of the defects as shown in the SEM images is performed (204) (e.g., as described for step 110 of the method 100, FIG. 1), with the defects being labeled accordingly.

The nuisance filter is trained (206) based on the defect classifications. Differences between the defect classification performed by the nuisance filter in step 202 and the automatic defect classification using SEM images in step 204 are identified, and the nuisance filter is modified to reduce (e.g., minimize) these differences.

It is determined (208) whether the nuisance filter has converged. The nuisance filter may be considered to have converged if the changes made in step 206 are of a degree that does not satisfy a threshold (e.g., are less than, or less than or equal to, the threshold, such that the changes are insubstantial). If the nuisance filter has not converged (208—No), then another iteration of steps 202-208 is performed. If the nuisance filter has converged (208—Yes), then the preliminary process window is defined (210) (e.g., as described for step 112 of the method 100, FIG. 1). In some embodiments, the preliminary process window is determined based on the automatic defect classification of step 204, which serves as ground truth. Data obtained in the method 200 may also be used to identify die structures having DOI in step 114 of the method 100 (FIG. 1).

Figure 3:
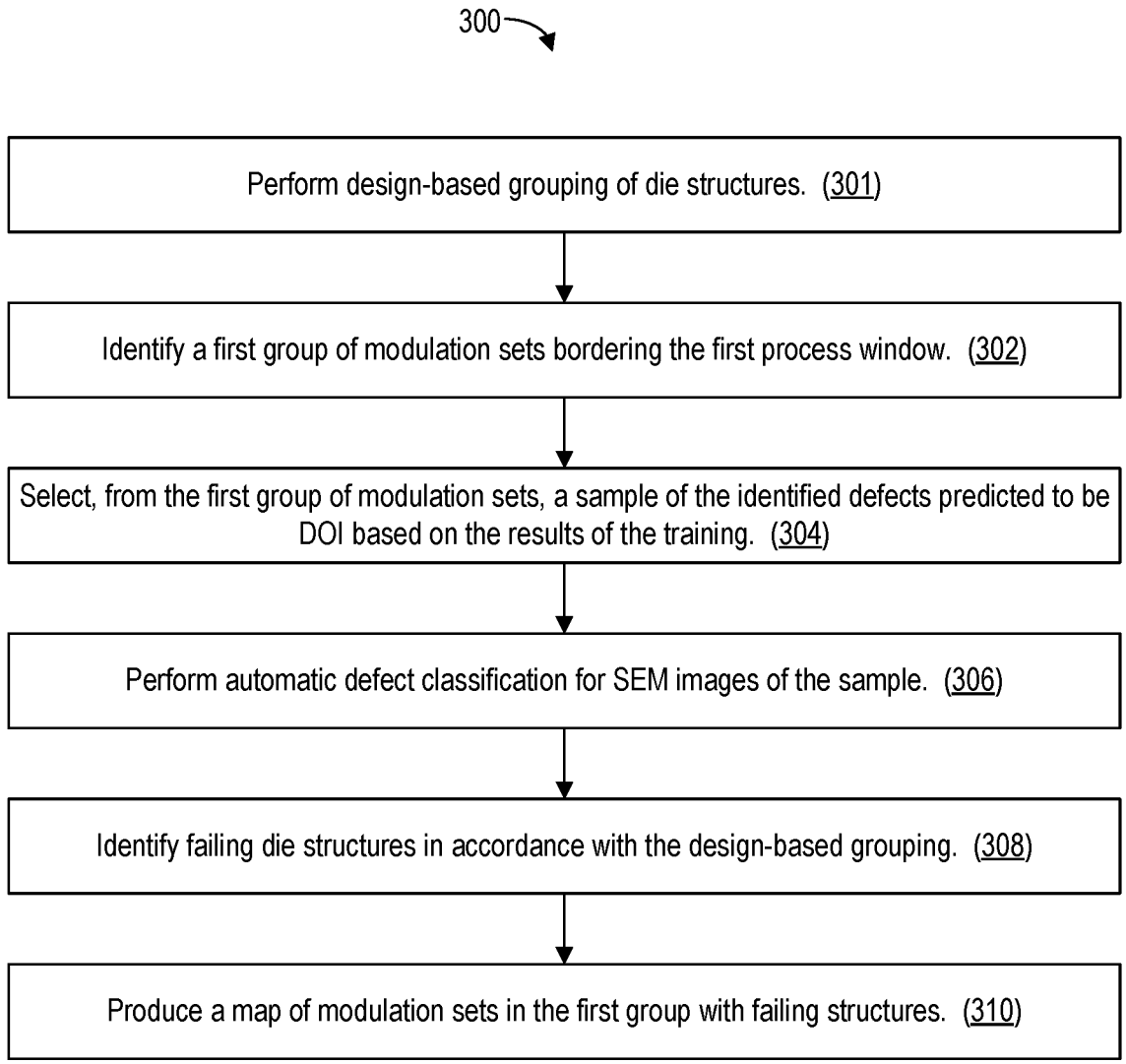
FIG. 3 is a flowchart showing a method of identifying die structures having DOI in accordance with some embodiments.

FIG. 3 is a flowchart showing a method 300 of identifying die structures having DOI (e.g., as in step 114 of the method 100, FIG. 1) in accordance with some embodiments. The method 300 may be performed using a semiconductor inspection system 900 (FIG. 9) or portion thereof.

In the method 300, design-based grouping of die structures is performed (301). A first group of modulation sets bordering the first process window (e.g., the modulation sets 708, FIG. 7B) is identified (302). A sample of the identified defects, predicted to be DOI based on the results of the training, is selected (304) from the first group of modulation sets. This selection may be performed using the result of the design-based grouping of step 301.

SEM images of the sample are reviewed and automatic defect classification for the SEM images is performed (306). This automatic defect classification determines which of the predicted DOI from step 304 are actually DOI, and labels the DOI accordingly. Failing die structures (i.e., die structures with DOI) in the first group of modulation sets are identified (308) in accordance with the design-based grouping of step 301. A map of modulation sets in the first group with failing structures is produced (310). For example, the wafer map of FIG. 7B, showing the modulation sets 708 with locations of failing die structures indicated, is produced.

Figure 4:
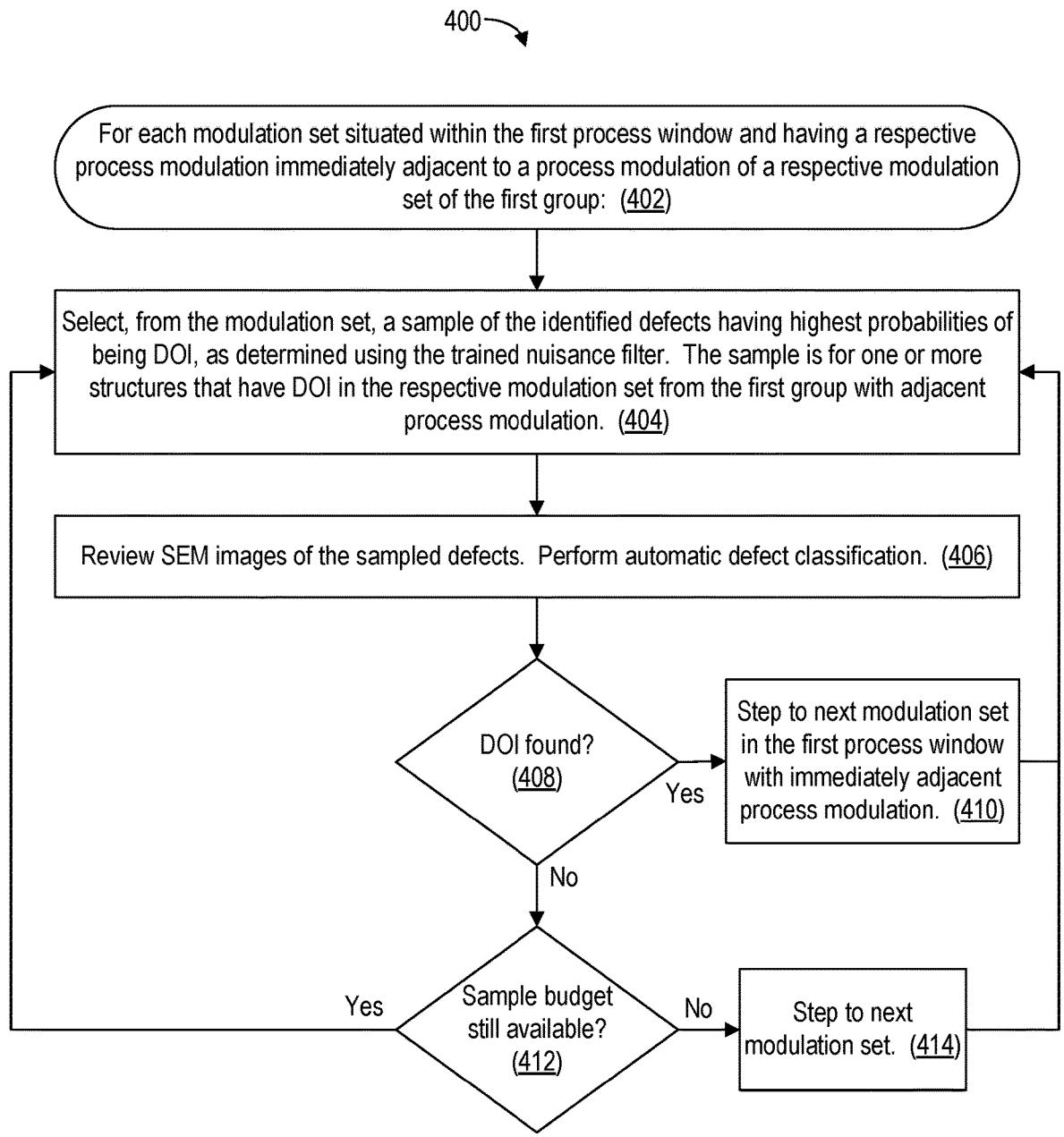
FIG. 4 is a flowchart showing a method of process-window revision in accordance with some embodiments.

FIG. 4 is a flowchart showing a method of process-window revision (e.g., as in step 116 of the method 100, FIG. 1) in accordance with some embodiments. The method 400 may be performed using a semiconductor inspection system 900 (FIG. 9) or portion thereof.

The method 400 is performed (402) for each modulation set that is situated within the first process window and that has a respective process modulation immediately adjacent to a process modulation of a respective modulation set of the first group. (The first process window was determined in step 112 of the method 100, FIG. 1). An example of such a modulation set is the modulation set 702-1 (FIG. 7B), which is in the process window of FIG. 7B and has a process modulation immediately adjacent to the process modulation of the modulation set 708-1 (assuming monotonic variation of a process parameter along the modulation-set columns of FIG. 7B). A sample of the identified defects having highest probabilities of being DOI, as determined using the trained nuisance filter, is selected (404) from the modulation set. The sample is for one or more structures that have DOI in the respective modulation set from the first group with adjacent process modulation. The sample thus may be for structures identified in step 114 of the method 100 (FIG. 1).

SEM images of the defects sampled in step 404 are reviewed and automatic defect classification is performed (406) for those SEM images, with defects in the SEM images being labeled accordingly. In some embodiments, the SEM images reviewed in step 404 were generated in the same instance of SEM imaging for the relevant semiconductor wafer as the SEM images of step 110 of the method 100 (FIG. 1), step 204 of the method 200 (FIG. 2), and/or step 306 of the method 300 (FIG. 3). If one or more DOI are found (408—Yes) in step 406, then execution of the method 400 steps (410) to the next modulation set in the first process window with a process modulation that is immediately adjacent to the process modulation of the modulation set used in the current iteration of steps 404-408, and a subsequent iteration of steps 404-408 is performed for the next modulation set. In this manner, the method 400 searches for process modulations for which respective structures no longer fail.

If no DOI are found (408—No) in step 406 but a sample budget for the modulation set of the current iteration still has availability (412—Yes), then execution of the method 400 reverts to step 404 for the modulation set of the current iteration: more identified defects for the modulation set are sampled in step 404, and steps 406 and 408 are repeated for the new samples. If no DOI are found (408—No) and no sample budget remains for the modulation set of the current iteration (412—No), then execution of the method 400 steps to the next modulation set that is situated within the first process window and that has a respective process modulation immediately adjacent to a process modulation of a respective modulation set of the first group, and an iteration of steps 404-408 is performed for that modulation set. If the method 400 has been performed for all such modulation sets, then execution of the method 400 ends.

In some embodiments, the method 400 results in identification of the modulation sets 710 (FIG. 7C), which border a revised, narrowed process window as compared to the process window of FIG. 7B.

Figure 5:
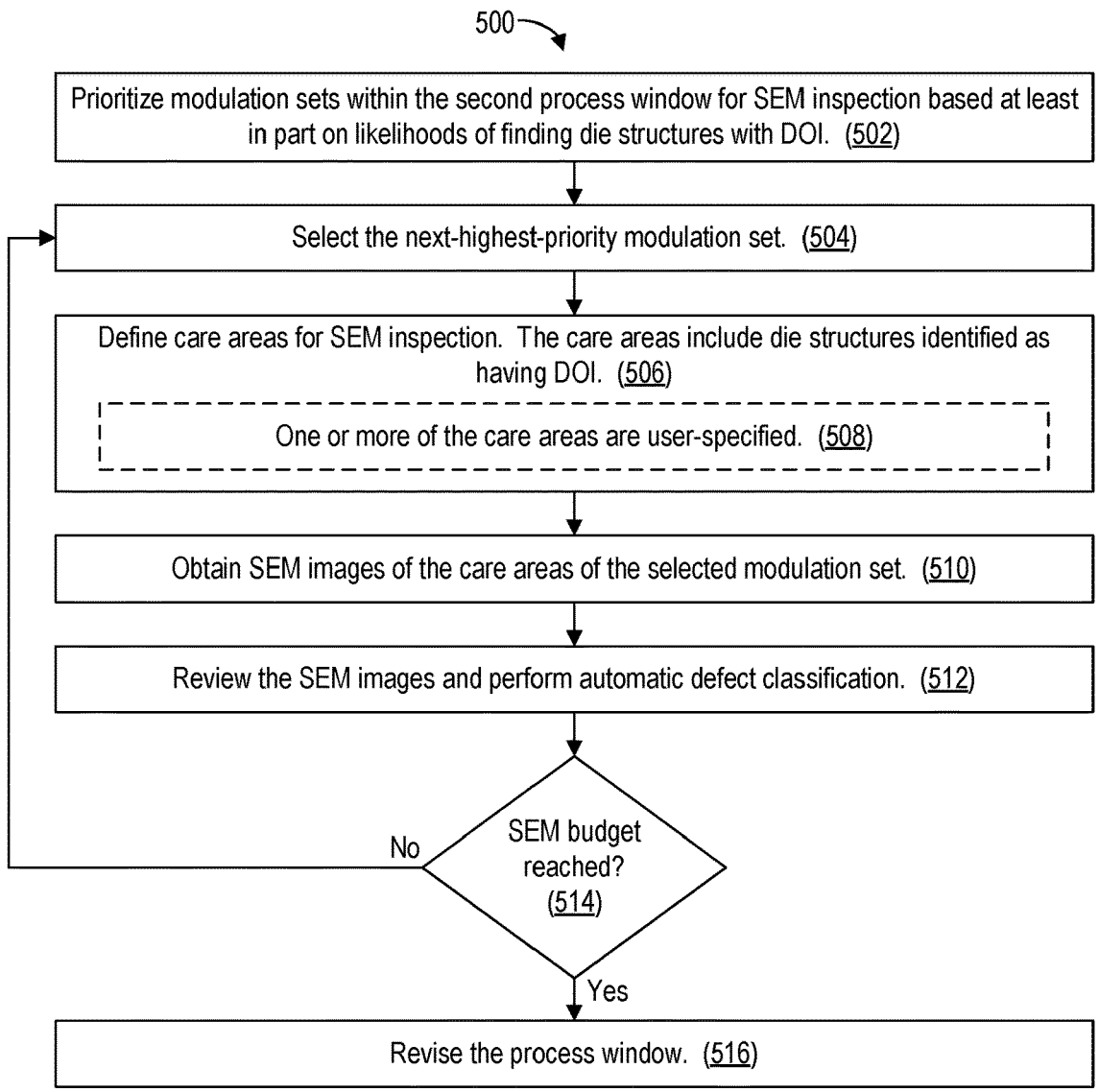
FIG. 5 is a flowchart showing a method of additional process-window revision (e.g., with respect to FIG. 4) in accordance with some embodiments.

FIG. 5 is a flowchart showing a method 500 of additional process-window revision (e.g., as in step 118 of the method 100, FIG. 1) in accordance with some embodiments. In some embodiments, the method 500 follows the method 400 (FIG. 4). The method 500 may be performed using a semiconductor inspection system 900 (FIG. 9) or portion thereof.

In the method 500, modulation sets within the second process window (e.g., the process window of FIG. 7C, which is bordered by but does not include the modulation sets 710) are prioritized (502) for SEM inspection based at least in part on likelihoods of finding die structures with DOI. (The second process window was determined in step 116 of the method 100, FIG. 1). The prioritization may be based further at least in part on the density of die structures to be inspected.

For the first iteration of the method 500, the highest-priority modulation set is selected, in accordance with the prioritization of step 502. For subsequent iterations of the method 500, the next-highest-priority modulation set is selected (504), in accordance with the prioritization of step 502.

Care areas for SEM inspection are defined (506). The care areas include die structures identified as having DOI in modulation sets outside the second process window. (By definition, no DOI have been identified yet for the modulation sets within the second process window.) The care areas to be inspected may be specific to a given modulation set, such that different care areas are defined for different modulation sets. Defining care areas to be specific to a given modulation set reflects the fact that different die structures are to be inspected for different modulation sets, since different die structures are suspected of failing in different modulation sets, in accordance with some embodiments. In some embodiments, one or more of the care areas are user-specified (508). For example, a user may specify care areas based on process simulations (e.g., optical proximity correction) that suggest defects might be likely on certain die structures.

In some embodiments, the die structures used to determine the care areas are identified by stacking all detected die structures having DOI from all modulation sets onto a single effective die. In some embodiments, this stacking is performed not for all modulation sets, but for respective groups of modulation sets. For example, the modulation sets may be divided into quadrants (e.g., quadrants with respective positive/negative values for focus and exposure) and detected die structures having DOI from a respective quadrant are stacked onto a single effective die that is used to identify care areas for modulation sets in the respective quadrant.

SEM images of the care areas of the selected modulation set are obtained (510). The SEM images are reviewed and automatic defect classification is performed (512) to determine whether previously undetected defects are present in the care areas. Defects detected in step 512 are thus defects that either were not detected through optical inspection (e.g., BBP inspection) or were detected but dismissed as nuisance defects. In some embodiments, the SEM images of step 510 are generated in one or more instances of SEM imaging for the relevant semiconductor that are performed later than the instance of SEM imaging that generated the SEM images of step 110 of the method 100 (FIG. 1), step 204 of the method 200 (FIG. 2), and/or step 306 of the method 300 (FIG. 3).

If a budget for SEM inspection has not been reached (514—No), execution of the method 500 returns to step 504 and another iteration of steps 504-512 is performed. Otherwise (514—Yes), the process window is revised (516) to exclude modulation sets with previously undetected DOI. For example, the modulation sets 712 (FIG. 7D) have previously undetected DOI that were identified in step 512. The modulation sets 712 are thus excluded from the process window of FIG. 7D.

By performing repeated iterations of the method 500 for respective modulation sets, SEM images of care areas of multiple prioritized modulations sets within the second process window of the method 100 (FIG. 1) may be obtained and automatic defect classification of these SEM images may be performed.

In some embodiments, the report generated in step 122 of the method 100 (FIG. 1) identifies the die structures identified as having DOI in step 512.

Figure 6:
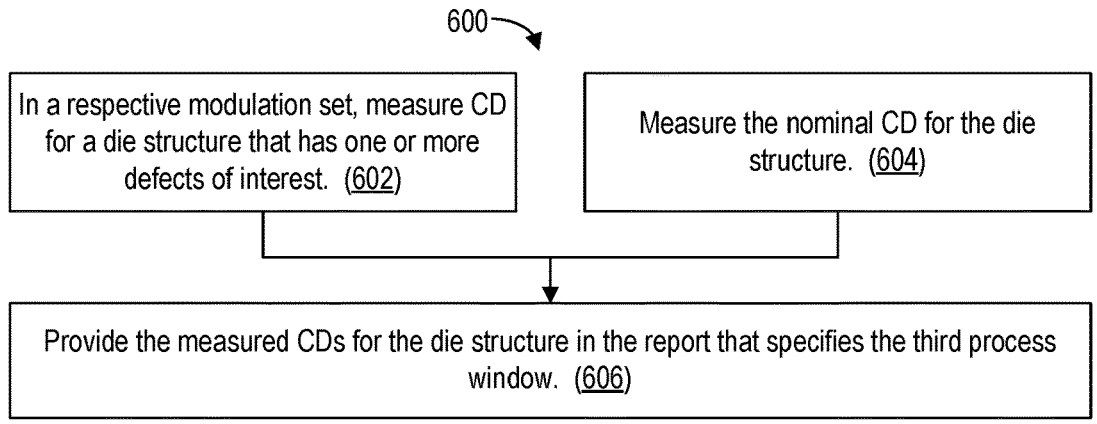
FIG. 6 is a flowchart showing a method of measuring critical dimension (CD) uniformity in accordance with some embodiments.

FIG. 6 is a flowchart showing a method 600 of measuring CD uniformity in accordance with some embodiments. The method 600 may be performed using a semiconductor inspection system 900 (FIG. 9) or portion thereof.

In the method 600, a CD is measured (602) in a respective modulation set for a die structure that has one or more DOI in that modulation set. The CD may be measured on a non-defective instance of the die structure in that modulation set. A nominal CD for the die structure is also measured (604). The nominal CD is measured on one or more die with nominal (e.g., unmodified) process parameters. The nominal CD may be an average (e.g., mean) of multiple (e.g., 20) nominal CD measurements.

The measured CDs for the die structure are provided (606) in the report that specifies the third process window (e.g., the report generated in step 122 of the method 100, FIG. 1). The report may specify both the CD in the respective modulation set and the nominal CD.

Figure 9:
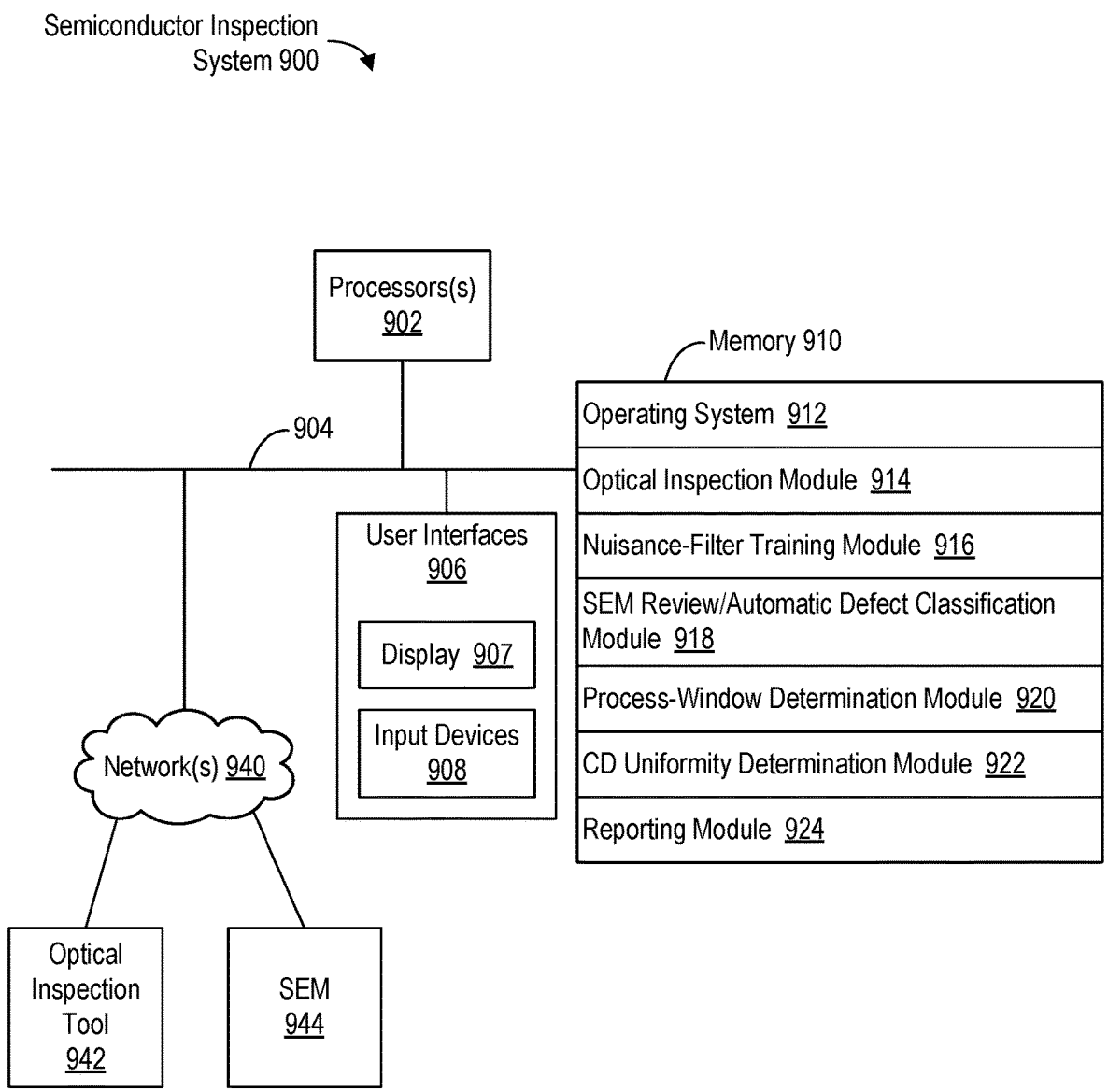
FIG. 9 is a block diagram of a semiconductor-inspection system in accordance with some embodiments.

FIG. 9 is a block diagram of a semiconductor-inspection system 900 in accordance with some embodiments. The semiconductor-inspection system 900 includes an optical inspection tool 942 (e.g., a BBP inspection tool), SEM 944, and a computer system with one or more processors 902 (e.g., CPUs), user interfaces 906, memory 910, and communication bus(es) 904 interconnecting these components. In some embodiments, the semiconductor-inspection system 900 includes multiple optical inspection tools 942 and/or SEMs 944. The computer system may be communicatively coupled with the optical inspection tool(s) 942 and SEM(s) 944 through one or more networks 940. The computer system may further include one or more network interfaces (wired and/or wireless, not shown) for communicating with the optical inspection tool(s) 942, SEM(s) 944, and/or remote computer systems.

The user interfaces 910 may include a display 907 and one or more input devices 908 (e.g., a keyboard, mouse, touch-sensitive surface of the display 907, etc.). The display 907 may display the report generated in the method 100.

Memory 910 includes volatile and/or non-volatile memory. Memory 910 (e.g., the non-volatile memory within memory 910) includes a non-transitory computer-readable storage medium. Memory 910 optionally includes one or more storage devices remotely located from the processors 902 and/or a non-transitory computer-readable storage medium that is removably inserted into the system 900. In some embodiments, memory 910 (e.g., the non-transitory computer-readable storage medium of memory 910) stores the following modules and data, or a subset or superset thereof: an operating system 912 that includes procedures for handling various basic system services and for performing hardware-dependent tasks, an optical inspection module 914, a nuisance-filter training module 916, a SEM review/automatic defect classification module 918, a process-window determination module 920, a CD uniformity determination module 922, and a reporting module 924. The memory 910 (e.g., the non-transitory computer-readable storage medium of the memory 910) thus includes instructions for performing the method 100 (FIG. 1). For example, the memory 910 (e.g., the non-transitory computer-readable storage medium of the memory 910) includes instructions for performing the methods 200, 300, 400, and/or 500 (FIGS. 2-5). The memory 910 may store nuisance filters trained using the nuisance-filter training module 916 and/or reports generated using the reporting module 924.

Each of the modules stored in the memory 910 corresponds to a set of instructions for performing one or more functions described herein. Separate modules need not be implemented as separate software programs. The modules and various subsets of the modules may be combined or otherwise re-arranged. In some embodiments, the memory 910 stores a subset or superset of the modules and/or data structures identified above.

FIG. 9 is intended more as a functional description of various features that may be present in a semiconductor-inspection system than as a structural schematic. For example, the functionality of the computer system in the semiconductor-inspection system 900 may be split between multiple devices. A portion of the modules stored in the memory 910 may alternatively be stored in one or more other computer systems communicatively coupled with the computer system of the semiconductor-inspection system 900 through one or more networks.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. A method of evaluating a semiconductor-fabrication process, comprising:
   obtaining a semiconductor wafer comprising a plurality of die grouped into modulation sets, wherein each modulation set is fabricated using distinct process parameters;
   optically inspecting the semiconductor wafer to identify defects in the modulation sets;

training a nuisance filter to classify the identified defects as defects of interest (DOI) or nuisance defects, comprising performing automatic defect classification for scanning-electron-microscope (SEM) images of a first sample of the identified defects to determine whether respective defects in the first sample are DOI or nuisance defects;

based on results of the training, determining a first, preliminary process window for the semiconductor wafer, the first process window being a window of process parameters for which respective modulation sets are free of DOI;

based on the results of the training, identifying die structures having DOI in a first group of modulation sets bordering the first process window;

applying the trained nuisance filter to the identified defects to determine a second, revised process window for the semiconductor wafer, comprising:

determining, for each modulation set situated within the first process window and having a respective process modulation immediately adjacent to a process modulation of a respective modulation set of the first group, whether the modulation set has one or more DOI for a structure identified as having a defect of interest in the respective modulation set of the first group;

determining a third, further revised process window for the semiconductor wafer based on SEM images of specified care areas in one or more modulation sets within the second, revised process window; and generating a report specifying the third process window.

2. The method of claim 1, wherein the distinct process parameters comprise a respective focus and a respective exposure for a photolithographic process step.

3. The method of claim 1, wherein optically inspecting the semiconductor wafer is performed using an optical inspection tool comprising a broadband plasma (BBP) light source.

4. The method of claim 1, wherein identifying the die structures having DOI in the first group of modulation sets comprises:

selecting, from the first group of modulation sets, a second sample of the identified defects predicted to be DOI based on the results of the training; and performing automatic defect classification for SEM images of the second sample.

5. The method of claim 1, wherein determining, for each modulation set situated within the first process window and having a respective process modulation immediately adjacent to a process modulation of a respective modulation set of the first group, whether the modulation set has one or more DOI for a structure identified as having a defect of interest in the respective modulation set of the first group comprises:

selecting, from the modulation set, a third sample of the identified defects having highest probabilities of being DOI, as determined using the trained nuisance filter; and performing automatic defect classification for SEM images of the third sample.

6. The method of claim 1, further comprising defining the care areas to include die structures identified as having DOI; wherein the report specifies one or more die structures having DOI in one or more modulation sets bordering the third process window.

7. The method of claim 6, wherein determining the third process window comprises:

prioritizing modulation sets within the second process window for SEM inspection based at least in part on likelihoods of finding die structures with DOI;

obtaining SEM images of the care areas of prioritized modulation sets within the second process window; and performing automatic defect classification for the SEM images of the care areas of the prioritized modulation sets within the second process window.

8. The method of claim 6, wherein one or more of the care areas are user-specified.

9. The method of claim 1, further comprising measuring critical-dimension uniformity for one or more die structures having DOI, wherein:

the report specifies the critical-dimension uniformity for the one or more die structures having DOI; and the one or more die structures comprise all die structures having DOI in modulation sets bordering the third process window.

10. A non-transitory computer-readable storage medium storing one or more programs for execution by one or more processors of a semiconductor-inspection system comprising an optical inspection tool, the one or more programs including instructions for:

for a semiconductor wafer comprising a plurality of die grouped into modulation sets, each modulation set being fabricated using distinct process parameters, optically inspecting the semiconductor wafer using the optical inspection tool to identify defects in the modulation sets;

training a nuisance filter to classify the identified defects as defects of interest (DOI) or nuisance defects, comprising performing automatic defect classification for scanning-electron-microscope (SEM) images of a first sample of the identified defects to determine whether respective defects in the first sample are DOI or nuisance defects;

based on results of the training, determining a first, preliminary process window for the semiconductor wafer, the first process window being a window of process parameters for which respective modulation sets are free of DOI;

based on the results of the training, identifying die structures having DOI in a first group of modulation sets bordering the first process window;

applying the trained nuisance filter to the identified defects to determine a second, revised process window for the semiconductor wafer, comprising:

determining, for each modulation set situated within the first process window and having a respective process modulation immediately adjacent to a process modulation of a respective modulation set of the first group, whether the modulation set has one or more DOI for a structure identified as having a defect of interest in the respective modulation set of the first group;

determining a third, further revised process window for the semiconductor wafer based on SEM images of specified care areas in one or more modulation sets within the second, revised process window; and generating a report specifying the third process window.

11. The non-transitory computer-readable storage medium of claim 10, wherein the distinct process parameters comprise a respective focus and a respective exposure for a photolithographic process step.

12. The non-transitory computer-readable storage medium of claim 10, wherein the optical inspection tool comprises a broadband plasma (BBP) light source.

13. The non-transitory computer-readable storage medium of claim 10, wherein the instructions for identifying the die structures having DOI in the first group of modulation sets comprise instructions for:
    selecting, from the first group of modulation sets, a second sample of the identified defects predicted to be DOI based on the results of the training; and
    performing automatic defect classification for SEM images of the second sample.

14. The non-transitory computer-readable storage medium of claim 10, wherein the instructions for determining, for each modulation set situated within the first process window and having a respective process modulation immediately adjacent to a process modulation of a respective modulation set of the first group, whether the modulation set has one or more DOI for a structure identified as having a defect of interest in the respective modulation set of the first group comprise instructions for:
    selecting, from the modulation set, a third sample of the identified defects having highest probabilities of being DOI, as determined using the trained nuisance filter; and
    performing automatic defect classification for SEM images of the third sample.

15. The non-transitory computer-readable storage medium of claim 10, wherein the one or more programs further comprise instructions for defining the care areas to include die structures identified as having DOI;
    wherein the report specifies one or more die structures having DOI in one or more modulation sets bordering the third process window.

16. The non-transitory computer-readable storage medium of claim 15, wherein the instructions for determining the third process window comprise instructions for performing automatic defect classification for SEM images of the care areas of prioritized modulation sets within the second process window.

17. The non-transitory computer-readable storage medium of claim 15, wherein one or more of the care areas are user-specified.

18. The non-transitory computer-readable storage medium of claim 10, wherein the one or more programs further comprise instructions for measuring critical-dimension uniformity for one or more die structures having DOI, wherein:
    the report specifies the critical-dimension uniformity for the one or more die structures having DOI; and
    the one or more die structures comprise all die structures having DOI in modulation sets bordering the third process window.

19. A semiconductor-inspection system, comprising:
an optical inspection tool;
one or more processors; and
memory storing one or more programs for execution by the one or more processors, the one or more programs comprising instructions for:
    for a semiconductor wafer comprising a plurality of die grouped into modulation sets, each modulation set being fabricated using distinct process parameters, optically inspecting the semiconductor wafer using the optical inspection tool to identify defects in the modulation sets;
    training a nuisance filter to classify the identified defects as defects of interest (DOI) or nuisance defects, comprising performing automatic defect classification for scanning-electron-microscope (SEM) images of a first sample of the identified defects to determine whether respective defects in the first sample are DOI or nuisance defects;
    based on results of the training, determining a first, preliminary process window for the semiconductor wafer, the first process window being a window of process parameters for which respective modulation sets are free of DOI;
    based on the results of the training, identifying die structures having DOI in a first group of modulation sets bordering the first process window;
    applying the trained nuisance filter to the identified defects to determine a second, revised process window for the semiconductor wafer, comprising:
    determining, for each modulation set situated within the first process window and having a respective process modulation immediately adjacent to a process modulation of a respective modulation set of the first group, whether the modulation set has one or more DOI for a structure identified as having a defect of interest in the respective modulation set of the first group;
    determining a third, further revised process window for the semiconductor wafer based on SEM images of specified care areas in one or more modulation sets within the second, revised process window; and
    generating a report specifying the third process window.

\* \* \* \* \*